United States Patent
Bendelli et al.

(10) Patent No.: US 6,797,989 B2
(45) Date of Patent: Sep. 28, 2004

(54) PACKAGE FOR OPTO-ELECTRICAL COMPONENTS

(75) Inventors: Giampaolo Bendelli, Almese (IT);
Enrico Di Mascio, Summona (IT);
Piero Gambini, Turin (IT); Mario Puleo, Borgosesia (IT); Marco Scofet, Rivarolo C.se (IT); Ian Smith, Woodbridge (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/256,173

(22) Filed: Sep. 27, 2002

(65) Prior Publication Data

US 2003/0057508 A1 Mar. 27, 2003

(30) Foreign Application Priority Data

Sep. 27, 2001 (EP) ............................................. 01308247

(51) Int. Cl.$^7$ .................. H01L 27/15; H01L 31/12; H01L 33/00; H01L 29/267; H01L 29/122; H01L 23/02; H01L 29/227; H01L 31/0203

(52) U.S. Cl. .............................. 257/99; 257/98; 257/81; 257/80; 257/422; 257/678

(58) Field of Search ............................... 257/80, 81, 98, 257/99, 432, 433, 666, 678, 691, 728, 724, 434, 100, 291, 290, 292, 293, 115

(56) References Cited

U.S. PATENT DOCUMENTS

| | | | | |
|---|---|---|---|---|
| 4,873,566 A | * | 10/1989 | Hokanson et al. | ............. 257/98 |
| 5,466,944 A | | 11/1995 | Krause | |
| 6,222,967 B1 | * | 4/2001 | Amano et al. | ................ 385/49 |
| 6,632,029 B1 | * | 10/2003 | Williamson et al. | .......... 385/92 |
| 2002/0190335 A1 | * | 12/2002 | Payer | ......................... 257/433 |

FOREIGN PATENT DOCUMENTS

| EP | 0 500 240 A1 | 8/1992 |
|---|---|---|
| EP | 0 588 014 A2 | 3/1994 |

* cited by examiner

Primary Examiner—Nathan J. Flynn
Assistant Examiner—Victor Mandala, Jr.

(57) ABSTRACT

A package for opto-electrical components includes a casing having a chamber for at least one board or tile adapted to carry the opto-electrical components. The casing includes a set of electrical connections including at least one radio-frequency differential line between the chamber and the casing exterior.

24 Claims, 3 Drawing Sheets

PACKAGE FOR OPTO-ELECTRICAL COMPONENTS

FIELD OF INVENTION

The present invention relates to packages for opto-electrical components, the term "opto-electrical components" being used herein to designate in general those circuits, assemblies or sub-assemblies comprising electrical, optical as well as opto-electronic (e.g., photodetectors, laser sources, etc.) devices. Exemplary of such packages are transmitter/receiver packages for optical transmission systems.

BACKGROUND ART

Such packages must in general comply with a number of requirements which are at least partly conflicting among them. For instance, the package structure should provide all the external constant electrical connections both at radio frequency (RF) and DC, and optical feed-through, as well as mechanical protection. Flexibility in the internal layout is also an extensively felt need, in that such a layout should be preferably chosen depending on the configuration of components to be included in the device. Electrical connections should be ensured with a high degree of reliability, the same also applying to the mechanical structure of the package. Finally, assembling the package should be easy, leaving a reasonable degree of freedom of movement.

Such requirements do not appear to be satisfactorily met by prior art package solutions which generally are provided for a fixed design.

The object of the present invention is thus to provide an improved solution which better complies with the needs outlined in the foregoing, especially as regards the quality of connection at the RF and the DC level.

SUMMARY OF THE INVENTION

According to the present invention, a package for opto-electrical components comprises a casing including a chamber for housing the opto-electrical components. The casing includes a set of electrical connections between the chamber and the exterior of the casing. The electrical connections include at least one radio-frequency differential line.

Preferably, the at least one differential line is in the form of strip-like elements. The casing preferably includes: a box-like portion including said chamber, and a base member supporting said box-like portion and having a protruding end carrying said electrical connections.

The electrical connections preferably include DC electrical connections. The housing chamber in one embodiment includes a conductive lateral wall and a dielectric base wall including via-holes for the DC electrical connections.

The housing chamber, in a second embodiment, includes an electrically insulating lateral wall and the DC electrical connections are in the form of strip-like elements extending through the lateral wall.

The electrical connection preferably has a general staircase-like arrangement including plural steps forming different levels of electrical connections.

The casing preferably includes an upper rim portion of the chamber and an electrically conductive layer at the chamber upper rim portion.

At least one board or tile for carrying the components can be housed in the casing chamber. The component carried by the board or tile is one of: a photodetector, a transimpedance amplifier, a limiting amplifier, a silicon optical bench, or passive electrical components.

The photodetector and at least the transimpedance amplifier can be mounted on the silicon optical bench.

The above and still further objects, features and advantages of the present invention will become apparent upon consideration of the following detailed descriptions of one specific embodiment thereof, especially when taken in conjunction with the accompanying drawings.

DETAILED DESCRIPTION OF THE DRAWING

Figure 1:
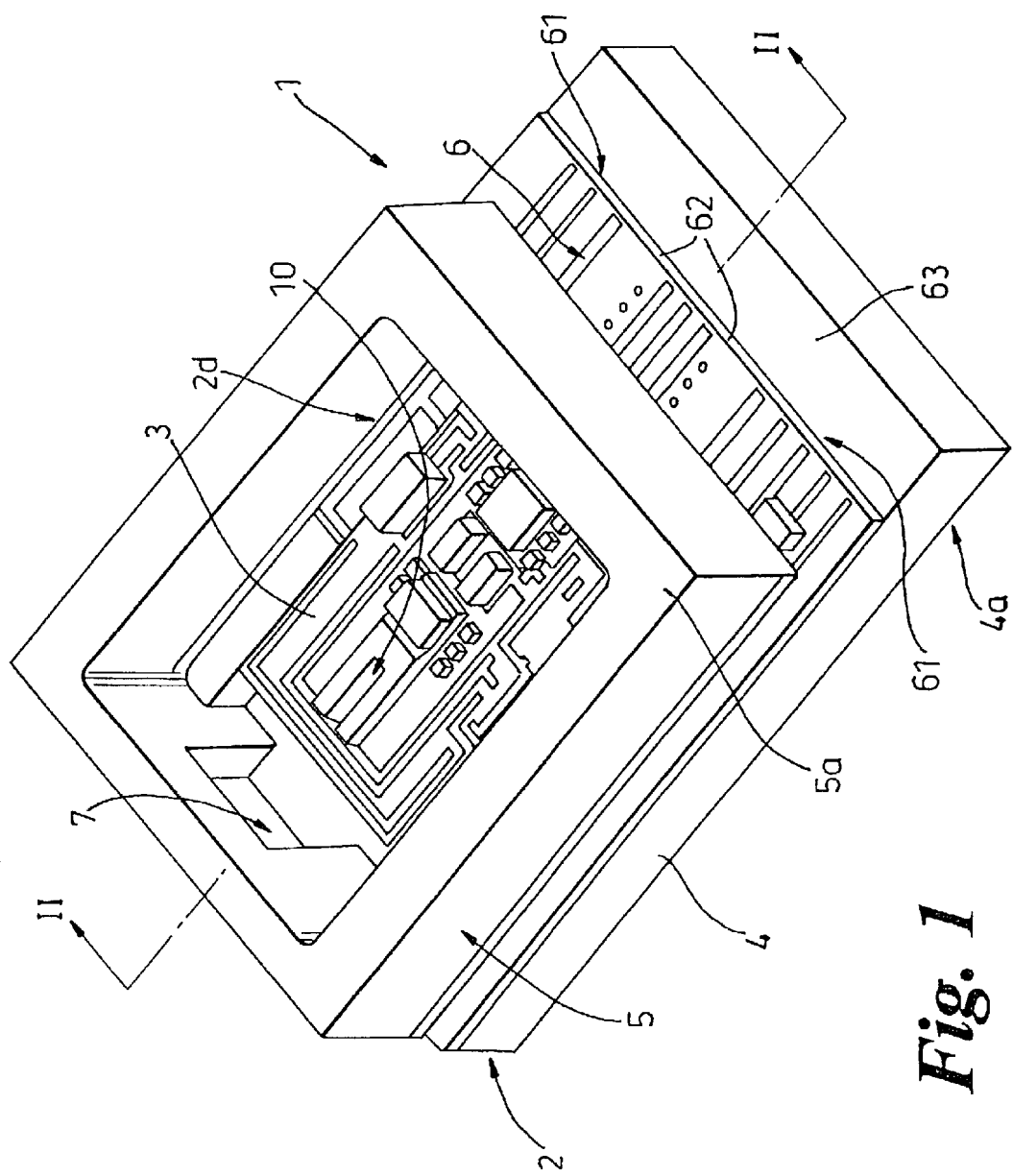
FIG. 1 is a perspective view of a preferred embodiment of a package according to the invention.

In the drawing, package 1 includes opto-electrical components that are typically parts of an optical receiver used in high bit-rate optical transmission systems.

Package 1 essentially includes two parts or portions, namely:

(1) a basic structure or casing 2 having preferably an overall vat-like or dish-shaped configuration thus defining a housing chamber 2a therein, and (2) a microboard or "tile" 3 essentially comprised of a card-like member (preferably having the typical structure of a current printed circuit or hybrid circuit board) adapted to be housed in chamber 2a.

Preferably, the arrangement of package 1 allows different microboards or tiles 3 selected from a wide—virtually infinite—gamut to be assembled into a single type of casing 2 following different needs/operations or requirements.

Still preferably, casing 2 includes a flat base member 4 constituting a sort of a socket having one end 4a protruding from the remaining portion of casing 2. This latter portion is essentially comprised of a sort of box-like member 5 extending upwardly from base member 4.

Box-like member 5 (whose internal cavity constitutes chamber 2a) is substantially rectangular in shape. Other shapes (round, oval, etc.) can obviously be chosen. However, a rectangular shape is held to better fit the shape of microboards or tiles 3, which are usually rectangular.

End 4a of base member 4 carries, on at least one of its surfaces, electrically conductive parts or strips, generally designated 6, which provide constant ohmic electrical connections (RF+DC) between the component receiving volume in chamber 2a intended to house microboards 3 and the outside of package 1.

As better described in the following, contacts 6 enable ohmic connection of package 1 to a flexible ribbon-type cable F (see FIG. 3).

The outer, peripheral wall of box-like member 5 of casing 2 also includes at least one opening 7 defining a so-called optical feed-through path i.e. a port for connecting one or more optical fibers (not shown) to respective components to be located within package 1. Preferably, optical feed-through port 7 is located opposite to end 4a carrying electrical connections 6.

Microboard or tile 3 includes tracks and pads (of a known type) adapted to carry the components to be supported by the microboard or tile. Microboard 3 is manufactured by methods which are well known in the area of printed circuit technology or hybrid circuit technology, thus making it unnecessary to provide a detailed description of these methods.

The lower portion of housing chamber 2a includes a shallow trench 8 into which microboard or tile 3 can be located.

Microboard or tile 3 is soldered to the rest of the package (essentially to the bottom of trench 8) thus creating a fully reliable mechanical structure inherently resistant to vibration and/or shock. Ohmic electrical connections between microboard or tile 3 (essentially the bottom surface thereof) and the rest of package 1 are preferably provided through ball bonding or wedge bonding depending on performance required.

Specific details of soldering microboard or tile 3 and ball bonding/wedge bonding thereof to casing 2 are not shown in the drawing but will be evident to those skilled in the art.

It will be appreciated that such soldering/bonding techniques are fully compatible with use a ceramic substrate for microboards or tiles 3.

Casing structure 2 is advantageously made of a unitary moulded piece of electrical insulating materials, such as a plastics material, which also ensure the required mechanical protection of the components involved.

Still more preferably, casing structure 2 is comprised of a ceramic material, such as layered alumina.

Figure 2:
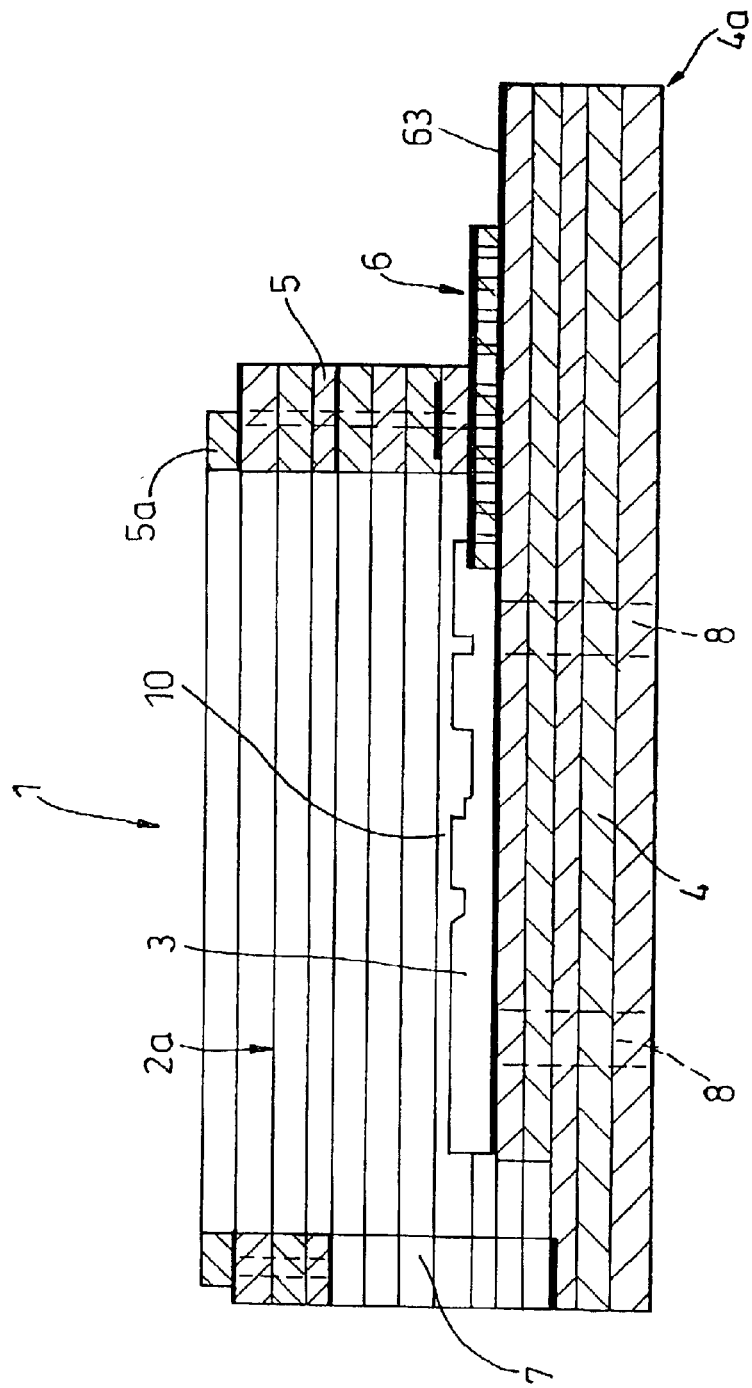
FIG. 2 is a cross-sectional view along line II—II of FIG. 1.

The cross-sectional view of FIG. 2 highlights the layered structure of both base member 4 and box-like member 5, which structure is obtained by known methods.

The layered structure of casing 2 can include one or more electrically conductive layers, such a bottom metal layer (not shown) enabling connection of the package to ground as well as an electrically-conductive (e.g. metal) layer 5a provided at the upper rim portion of box-like member 5 which surrounds housing chamber 2a.

Layer 5a is preferably provided in order to permit closing the package by means of a conductive lid (not shown). Layer 5a is preferably an iron-nickel-cobalt alloy commercially available under the designation KOVAR™. Layer 5a is glued and/or brazed to the remaining part of casing 2 in order to obtain fluid-tight sealing of the package.

The package of the invention in thus adapted to house a number of opto-electrical components, generally designated 10, carried by board 3.

Such components include, e.g., a PIN photodiode mounted with an associated transimpedance amplifier on a common silicon optical bench (SiOB). Board 3 also can carry additional active components, such as a limiting amplifier, as well as passive electrical components, such as bypass and decoupling capacitors, biasing resistors, etc.

Preferably the bottom wall of chamber 2a is populated by via-holes 8, schematically shown in dotted lines in FIG. 2 only, thus enabling package connections to printed circuits board (PCB) e.g. by means of a Ball Grid Array (BGA) configuration.

Alternatively, the connection can be achieved by brazed leads.

The photodetector mounted on the silicon bench carried by board 3 is accurately coupled with an optical fiber F of an optical cable OC. Cable OC is adapted to be coupled with optical feed-through port 7, preferably by means of an adapter 9 having a circular through hole for the fiber F provided in a portion closely fitting into opening 7. As shown in FIG. 2, opening 7 usually has a parallelogram shape dictated by casing 2 being manufactured by means of layered ceramic material.

As indicated, electrical connections 6 provided at the upper surface of protruding portion 4a of base member 4 include both DC feed-through lines as well as RF feed-throughs 62.

DC feed-throughs 61 at portion 4a can be additional or alternative to DC feed-throughs provided by means of via-holes 8 in the bottom portion of casing.

Thus, in general terms, DC feed-throughs can be allocated on one or two sides of package 1, specifically the lateral and the back sides of casing 2.

When the wall of box-like member 5—which defines housing chamber 2a—is comprised of an electrically conductive material (such as KOVAR), DC feed-throughs are preferably realised by resorting to vias 8 in base member 4.

Figure 3:
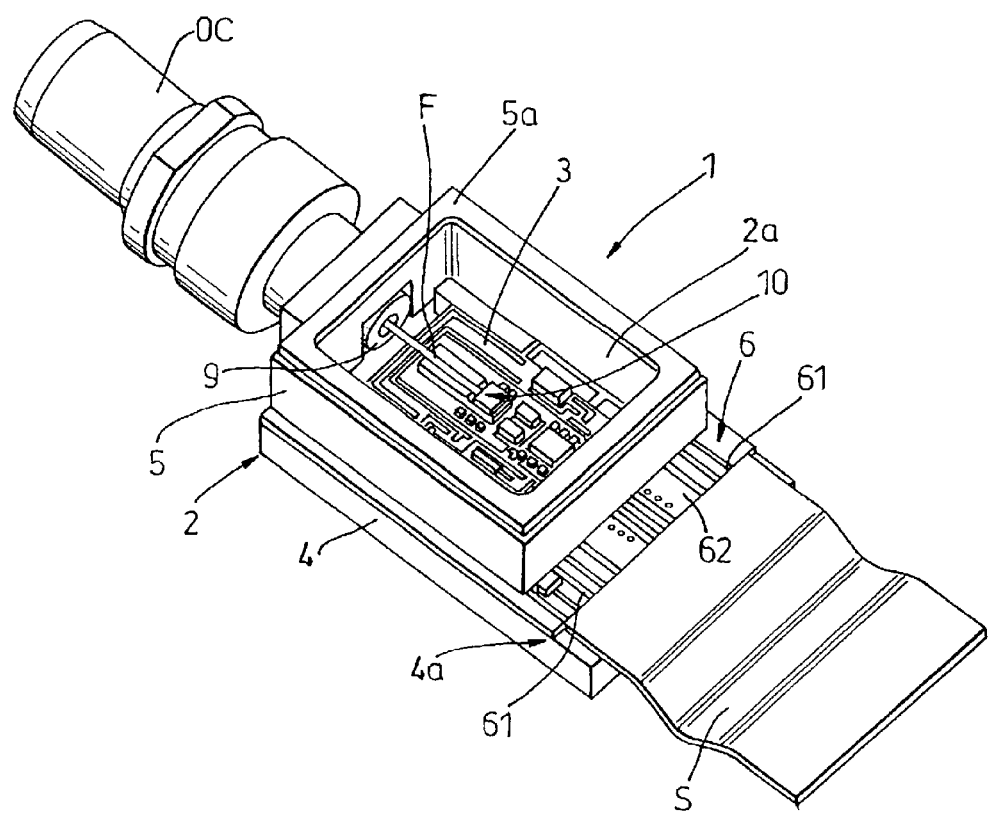
FIG. 3 is a perspective view of the package of FIGS. 1 and 2 in combination with a typical connection arrangement.

Conversely, when the wall box-like member 5 (and casing 2 overall) is comprised of an electrical insulating material, such as a dielectric ceramic material, DC feed-through can take place either through vias 8 or through coplanar tracks extending through the insulating wall such as tracks 61 shown in FIG. 3.

RF feed-throughs 62 are generally provided as coplanar tracks in the form of differential lines as clearly shown in both FIGS. 1 and 3. A differential line includes two wires, one of which carries a normal signal (V) and the other carries an inverted version (−V) of the signal. Use of a differential arrangement is advantageous for a number of reasons including sensitivity to noise phenomena, which is reduced for differential arrangements in comparison to standard unbalanced RF connectors currently adopted in prior-art packages.

As best seen in the cross sectional view of FIG. 2, contacts 6, and especially RF differential lines 62 (i.e. differential lines for handling RF signals) are preferably provided in a general staircase-like arrangement.

In the embodiment shown, such an arrangement includes a single step separating lines 62 from an electrically conductive base layer 63.

A complementary arrangement is included in ribbon cable S.

In alternative embodiments (not shown) the staircase-like arrangement includes a larger number of different levels of contacts to ensure bonding to conductive lines provided at different levels of board 3.

Of course, the basic principle of the invention remaining the same, the details and embodiments may significantly vary with respect to the exemplary embodiment shown and described herein without departing from the scope of the invention, as defined by the annexed claims.

What is claimed is:

1. A package for an opto-electrical component comprising a casing including a chamber for housing said opto-electrical component, said casing including a set of electrical connections between said chamber and the exterior of said casing, said electrical connections including at least one differential line including a pair of wires for coupling first and second RF signals that are inverted versions of each other between the components and the exterior of the casing, the at least one differential line being included as strip-like elements on a board having a grounded metal layer, the casing including a box-like portion including said chamber and a base member supporting said box-like portion and having a protruding end carrying said electrical connections, the said connections including DC electrical connections, the housing chamber including a conductive lateral wall and a dielectric base wall, said dielectric base wall including via-holes for said DC electrical connections.

2. The package of claim 1, wherein said casing includes:
   a box-like portion including said chamber, and
   a base member supporting said box-like portion and having a protruding end carrying said electrical connections.

3. The package of claim 1 in combination with the component, the component being an opto-electronic transducer.

4. The package of claim 3, wherein said electrical connections include DC electrical connections included as strip-like elements on the board outside of the pair of wires included in the differential line.

5. The package of claim 1, wherein said base member and sidewalls of said box-like portion include a layered material.

6. The package of claim 5, wherein said layered material is a ceramic material.

7. The package of claim 5, wherein said layered material is alumina.

8. A package for an opto-electrical component, comprising a casing including a chamber for housing said opto-electrical component, said casing including a set of electrical connections between said chamber and the exterior of said casing, said electrical connections including at least one differential line including a pair of wires for coupling first and second RF signals that are inverted versions of each other between the components and the exterior of the casing, wherein said at least one of differential line is included as strip-like elements on a board having a grounded metal layer, wherein said casing includes:
   a box-like portion including said chamber, and
   a base member supporting said box-like portion and having a protruding end carrying said electrical connections, and
   wherein said electrical connections include DC electrical connections, and
   said electrical connections having a general staircase-like arrangement.

9. The package of claim 8, wherein said casing includes:
   a box-like portion including said chamber, and
   a base member supporting said box-like portion and having a protruding end carrying said electrical connections.

10. The package of claim 8, wherein said electrical connections include DC electrical connections.

11. The package of claim 8, wherein said box-like portion includes electrically conductive vias.

12. The package of claim 8, wherein said staircase-like arrangement includes a plurality of steps forming different levels of electrical connections.

13. The package of claim 12, wherein said casing includes an upper rim portion of said chamber and an electrically conductive layer at said upper rim portion of said chamber.

14. The package of claim 13, further including at least one board or tile for carrying said components, said board or tile being adapted to be housed in said chamber of said casing, said board or tile carrying components selected from the group consisting of:
   a photodetector,
   a transimpedance amplifier,
   a limiting amplifier,
   a silicon optical bench, and
   passive electrical components.

15. The package of claim 14, furthering including said photodetector and at least said transimpedance amplifier mounted on said silicon optical bench.

16. A package for an opto-electrical component, comprising a casing including a chamber for housing said opto-electrical component, said casing including a set of electrical connections between said chamber and the exterior of said casing, said electrical connections including at least one differential fine including a pair of wires for coupling first and second RF signals that are inverted versions of each other between the components and the exterior of the casing, said electrical connections having a general staircase-like arrangement.

17. The package of claim 16, wherein said casing includes an upper rim portion of said chamber and an electrically conductive layer at said upper rim portion of said chamber.

18. The package of claim 16, further including at least one board or tile for carrying said components, said board or tile being adapted to be housed in said chamber of said casing, said board or tile carrying components selected from the group consisting of:
   a photodetector,
   a transimpedance amplifier,
   a limiting amplifier,
   a silicon optical bench, and
   passive electrical components.

19. The package of claim 16 in combination with the component, the component being an opto-electronic transducer.

20. The package of claim 16, wherein said electrical connections include DC electrical connections included as strip-like elements on the board outside of the pair of wires included in the differential line.

21. The package of claim 16 wherein said casing includes a base member and a box-like portion, said base member and sidewall of said box-like portion including a layered material.

22. The package of claim 21, wherein said layered material is a ceramic material.

23. The package of claim 21, wherein said layered material is alumina.

24. The package of claim 21, wherein said box-like portion includes electrically conductive vias.

* * * * *